(12) United States Patent
Murakami et al.

(10) Patent No.: US 8,158,308 B2
(45) Date of Patent: Apr. 17, 2012

(54) NEGATIVE CURABLE COMPOSITION, COLOR FILTER, AND METHOD OF PRODUCING THE SAME

(75) Inventors: Yosuke Murakami, Haibara-gun (JP); Toru Fujimori, Haibara-gun (JP)

(73) Assignee: Fujifilm Corporation, Tokyo (JP)

( * ) Notice: Subject to any disclaimer, the term of this patent is extended or adjusted under 35 U.S.C. 154(b) by 1005 days.

(21) Appl. No.: 12/047,060

(22) Filed: Mar. 12, 2008

(65) Prior Publication Data

US 2008/0226994 A1   Sep. 18, 2008

(30) Foreign Application Priority Data

Mar. 14, 2007   (JP) .................. 2007-064801

(51) Int. Cl.
   *G03F 7/00* (2006.01)
   *G02B 5/20* (2006.01)
(52) U.S. Cl. ............ 430/7; 430/270.1; 430/288.1
(58) Field of Classification Search .............. None
   See application file for complete search history.

(56) References Cited

U.S. PATENT DOCUMENTS

2005/0250024 A1 * 11/2005 Fujimori ................. 430/7
2006/0036023 A1   2/2006 Kamata et al.

FOREIGN PATENT DOCUMENTS

| EP | 0 881 541 A1 | 12/1998 |
|---|---|---|
| JP | 5463903 A | 5/1979 |
| JP | 2199403 A | 8/1990 |
| JP | 2273411 A | 11/1990 |
| JP | 07-064283 A | 3/1993 |
| JP | 05-142778 A | 6/1993 |
| JP | 6075375 A | 3/1994 |
| JP | 10253815 A | 9/1998 |
| JP | 10253816 A | 9/1998 |
| JP | 3120547 B2 | 10/2000 |
| JP | 2006-078602 A | 3/2006 |
| JP | 2006071890 A | 3/2006 |

OTHER PUBLICATIONS

Office Action dated Jun. 14, 2011 in Japanese Patent Application No. 2007-064801.

* cited by examiner

*Primary Examiner* — John A. McPherson
(74) *Attorney, Agent, or Firm* — Sughrue Mion, PLLC

(57) ABSTRACT

The invention provides a negative curable composition comprising a colorant, a photopolymerization initiator, a radical polymerizable monomer, a binder, and a monofunctional thiol compound, wherein the content of the radical polymerizable monomer with respect to the total solid content of the composition is from about 10 mass % to about 50 mass %, and the content of the binder with respect to the total solid content of the composition is about 20 mass % or less; a color filter formed by using the composition; and a method of producing the color filter. The negative curable composition has excellent developability at high sensitivity and enables formation of a fine rectangular pattern even in a low-binder content formulation.

9 Claims, No Drawings

NEGATIVE CURABLE COMPOSITION, COLOR FILTER, AND METHOD OF PRODUCING THE SAME

CROSS-REFERENCE TO RELATED APPLICATION

This application claims priority under 35 USC 119 from Japanese Patent Application No. 2007-064801, the disclosure of which is incorporated by reference herein.

BACKGROUND

1. Field of the Invention

The present invention relates to a negative curable composition that is favorable for formation of a color image that is a component of a color filter used in liquid crystal displays, solid-state image sensors and the like, to a color filter formed using the negative curable composition, and to a method of producing the same.

2. Description of the Related Art

A staining method, a printing method, an electrodeposition method and a pigment dispersion method are known as methods of producing a color filter used in liquid crystal displays (LCD) and solid-state image sensors (CCD, CMOS and the like).

Among these methods, the pigment dispersion method is a method of producing a color filter by a photolithographic method using a colored radiation-sensitive composition having a pigment dispersed in various photosensitive compositions, which is advantageous in terms of stability with respect to light, heat and the like as a result of the use of a pigment. Further, as a result of patterning by a photolithographic method, positional precision is high, and this method is widely used as a favorable method for producing a color filter for use in a large-screen high-definition color display.

When producing a color filter by the pigment dispersion method, a radiation-sensitive composition is applied onto a glass substrate using a spin coater, a roll coater or the like and dried to form a coating film, colored image pixels are formed by pattern exposure and development of the coating film, and a color filter can be obtained by repeating this operation for respective colors.

A method using a negative photosensitive composition that includes a photopolymerizable monomer and a photopolymerization initiator in combination in an alkali-soluble resin has been disclosed as one of the aforementioned pigment dispersion method (see, for example, Japanese Patent Application Laid-Open (JP-A) Nos. 2-199403 and 2-273411).

In recent years, ever higher definition is demanded of color filters for solid-state image sensors. However, it is difficult to further improve resolution in a conventional pigment dispersion method, and problems occur such as color irregularities caused by coarse pigment particles. As a result of this, this method has not been appropriate for applications requiring a fine pattern such as solid-state image sensors.

In order to address such problems, a technique using a dye instead of the conventional pigment has been proposed (see, for example, JP-A No. 6-75375). Generally, curable compositions including a dye have been inferior compared to curable compositions using a pigment in terms of a number of properties such as light resistance, heat resistance, solubility and coating uniformity. In particular, since a film thickness of 1.5 μm or less is required in the case of producing color filters for solid-state image sensors, a large amount of coloring must be added to the curable composition which can result in insufficient adhesion to a substrate, insufficient curing, insufficient dye even in the exposed portion and other problems that make pattern formation extremely difficult.

Further, ene-thiol polymerization systems have been researched for many years as methods of improving the curability of a curable composition (see, for example, JP-A Nos. 54-63903, 10-253815, 10-253816 and 2006-71890, and Japanese Patent (JP) No. 3120547).

However, in the polymerization system taught in JP-A No. 54-63903, active olefin or aryl ether is used as a compound having an ene structure, which results in problems such as poor stability of the curable composition, and particularly results in a large number of problems in application to formation of a fine pattern.

Further, in the polymerization systems taught in JP-A Nos. 10-253815, 10-253816 and 2006-71890 and JP No. 3120547, a number of applications for thiol compounds in color filter systems are disclosed; however, the type of photopolymerization initiators are limited and the compositions have a specialized system and thus can hardly be said to be versatile techniques. In addition, these references do not teach any findings related to technical disclosure for the formation of fine patterns.

In other words, in conventional techniques related to ene-thiol systems, it has been difficult to form rectangular patterns. In addition, the storage stability of curable compositions has been poor and improvement thereof is required.

The present inventors intensively researched the components of negative curable compositions in order to solve the above problems, as a result of which it was found that a negative curable composition having excellent developability at high sensitivity, and also the capability to form a rectangular fine pattern, could be obtained by using a monofunctional thiol compound in a low-binder content formulation, and thus accomplished the present invention.

SUMMARY OF THE INVENTION

According to an aspect of the invention, there is provided a negative curable composition comprising a colorant, a photopolymerization initiator, a radical polymerizable monomer, a binder, and a monofunctional thiol compound, wherein the content of the radical polymerizable monomer with respect to the total solid content of the composition is from about 10 mass % to about 50 mass %, and wherein the content of the binder with respect to the total solid content of the composition is about 20 mass % or less.

DETAILED DESCRIPTION OF THE INVENTION

The negative curable composition of the present invention includes at least a colorant (A), a photopolymerization initiator (B), a radical-polymerizable monomer (C), a binder (D) and a monofunctional thiol compound (E). The content of the radical-polymerizable monomer (C) with respect to the total solid content is 10-50 mass %, and the content of the binder (D) with respect to the total solid content is no more than 20 mass %.

By including a monofunctional thiol compound, a negative curable composition can be obtained that exhibits excellent developability at high sensitivity and is capability of forming a rectangular pattern (particularly when forming a pattern by stepper exposure), in a low binder content formulation.

Colorant (A)

The negative curable composition of the present invention includes at least one kind of colorant. Pigments and dyes known for use in conventional color filters may be used as the colorant in the present invention without particular restriction.

Pigments

Examples of pigments that can be included in the negative curable composition of the present invention include various conventionally-known inorganic pigments and organic pigments; however, pigments with high transmission are preferable. Pigments with high transmission as referred to herein indicate pigments with low light absorbance of 600-700 nm for pigments used in a red color filter, pigments with low light absorbance of 525-575 nm for pigments used in a green color filter and pigments with low light absorbance of 425-475 nm for pigments used in a blue color filter.

Examples of inorganic pigments include metal compounds represented by metal oxides, metal complex salts and the like; specifically, metal oxides of iron, cobalt, aluminum, cadmium, lead, copper, titanium, magnesium, chromium, zinc, antimony and the like, and composite oxides of said metals.

Examples of organic pigments include:

C.I. Pigment Yellow 11, 24, 31, 53, 83, 93, 99, 108, 109, 110, 138, 139, 147, 150, 151, 154, 155, 167, 180, 185 and 199;

C.I. Pigment Orange 36, 38, 43 and 71;

C.I. Pigment Red 81, 105, 122, 149, 150, 155, 171, 175, 176, 177, 209, 220, 224, 242, 254, 255, 264 and 270;

C.I. Pigment Violet 19, 23, 32 and 39;

C.I. Pigment Blue 1, 2, 15, 15:1, 15:3, 15:6, 16, 22, 60 and 66;

C.I. Pigment Green 7, 36 and 37;

C.I. Pigment Brown 25 and 28;

C.I. Pigment Black 1 and 7;

Carbon Black; and the like.

In the present invention, a pigment that includes a basic nitrogen atom in the structural formula of the pigment may be particularly preferably used. Pigments including a basic nitrogen atom exhibit favorable dispersibility in the negative curable composition of the present invention. The reason for this has not been sufficiently explained, but the dispersibility is thought to be influenced by a high affinity between a polymerizable component and the pigment.

Examples of pigments that can be preferably used in the present invention include the following; however, the present invention is not limited thereto:

C.I. Pigment Yellow 11, 24, 108, 109, 110, 138, 139, 150, 151, 154, 167, 180 and 185;

C.I. Pigment Orange 36 and 71;

C.I. Pigment Red 122, 150, 171, 175, 177, 209, 224, 242, 254, 255 and 264;

C.I. Pigment Violet 19, 23 and 32;

C.I. Pigment Blue 15:1, 15:3, 15:6, 16, 22, 60 and 66; and

C.I. Pigment Black 1.

These organic pigments may be used singly or in combination of two or more kinds. Use of two or more kinds of pigment in combination enables improvement of the color purity of the pigment. When, for example, the colored photosensitive composition of the present invention is used in the formation of a colored pattern of a color filter, it is preferable to use two or more kinds of pigment in combination. This enables further improvement of the color purity of the colored pattern of the color filter.

Specific examples of pigments and combinations of pigments are indicated below.

Examples of a red pigment include single use of any anthraquinone pigment, perylene pigment or diketopyrrolopyrrole pigment, and examples of combinations include use of at least one kind of these red pigments in combination with at least one kind of disazo yellow pigment, isoindoline yellow pigment, quinophthalone yellow pigment or perylene red pigment.

Examples of the anthraquinone pigments include C.I. Pigment Red 177, examples of the perylene pigments include C.I. Pigment Red 155 and C.I. Pigment Red 224, and examples of the diketopyrrolopyrrole pigments include C.I. Pigment Red 254.

In the present invention, a combination of an anthraquinone pigment, a perylene pigment or a diketopyrrolopyrrole pigment with C.I. Pigment Yellow 139 is preferable in view of color reproducibility.

The mass ratio of the red pigment and the yellow pigment in the combination (red/yellow) is preferably 100/50-100/5. If the mass ratio is 100/5 or less, it is possible to suppress transmission of light of 400-500 nm, and it becomes easier to further improve color purity. If the mass ratio is 100/50 or more, it is possible to prevent the dominant wavelength from tending toward the short wavelength, and aberration from the NTSC target color gamut can be further reduced. A range of 100/30-100/10 is particularly favorable for the mass ratio. Further, when two or more kinds of red pigment are combined, the respective content ratios may be adjusted in conjunction with the color.

As a green pigment, an halogenated phthalocyanine pigment may be used singly or mixed with a disazo yellow pigment, a quinophthalone yellow pigment, an azomethine yellow pigment or an isoindoline yellow pigment. Preferable combinations include, for example, C.I. Pigment Green 7, 36 or 37 with C.I. Pigment Yellow 83, C.I. Pigment Yellow 138, C.I. Pigment Yellow 139, C.I. Pigment Yellow 150, C.I. Pigment Yellow 180 or C.I. Pigment Yellow 185.

The mass ratio of the green pigment and the yellow pigment in the combination (green/yellow) is preferably 100/150-100/5, and is particularly preferably in the range of 100/120-100/30.

As a blue pigment, a phthalocyanine pigment may be used singly or in combination with a dioxazine purple pigment. A mixture of, for example, C.I. Pigment Blue 15:6 with C.I. Pigment Violet 23 is preferable.

The mass ratio of the blue pigment and the purple pigment in the combination (blue/purple) is preferably 100/30-100/1, and is more preferably 100/10-100/1.

Further, carbon, titanium carbide, iron oxide and titanium oxide may be used singly or in combination as a pigment used when the negative curable composition of the present invention is used in the formation of a black matrix for a color filter, and a combination of carbon and titanium carbide is preferable. Further the mass ratio of carbon and titanium carbide in the combination (carbon/titanium carbide) is preferably in the range of 100/60-100/1.

When the colored photosensitive composition of the present invention is used for a color filter, the primary particle diameter of the pigment that is the colorant is preferably 100 nm or less in view of color uniformity and contrast and, further, is preferably 5 nm or more in view of dispersion stability. The primary particle diameter of the pigment is more preferably 5-75 nm, still more preferably 5-55 nm, and particularly preferably 5-35 nm.

The primary particle diameter of the pigment can be measured by a known method using an electron microscope or the like.

The pigment of the present invention is preferably selected from anthraquinone, azomethine, benzylidene, cyanine, diketopyrrolopyrrole and phthalocyanine pigments.

Dyes

It is preferable to use a dye as the colorant of the present invention in view of achieving high definition of the color filter. Dyes that may be included in the negative curable composition of the present invention are not particularly limited, but examples thereof include dyes that are known for use in conventional color filters. Examples of these known dyes include dyes described in JP-A Nos. 64-90403, 64-91102, 1-94301 and 6-11614, JP No. 2592207, U.S Pat. Nos. 4,808, 501, 5,667,920 and 5,059,500, and JP-A Nos. 5-333207, 6-35183, 6-51115 and 6-194828. Examples of the chemical structure of the dyes that can be used as dyes that are soluble in an organic solvent in the present invention include triphenylmethane series, anthraquinone series, benzylidene series, oxonol series, cyanine series, phenothiazine series, pyrrolopyrazole azomethine series, xanthene series, phthalocyanine series, benzopyran series and indigo series dyes. Pyrazole azo series, anilino azo series, pyrazolotriazole azo series, pyridone azo series, anthraquinone series and anthrapyridone series dyes are particularly preferable as dyes that are soluble in an organic solvent in the present invention.

Further, acidic dyes and/or derivatives thereof may favorably be used as dyes that are soluble in an organic solvent in the present invention in view of complete removal of a binder and/or a dye by development in the case of a resist system that performs water or alkaline development. In addition, direct dyes, basic dyes, mordant dyes, acid mordant dyes, azoic dyes, dispersive dyes, oil soluble dyes, foodstuff dyes and/or derivatives thereof may favorably be used as dyes that are soluble in an organic solvent in the present invention.

(Acidic dyes)

The acidic dyes described above are explained. The acidic dyes are not particularly limited as long as the dye pigment has an acidic group such as a sulfo group, a carboxyl group or a phenolic hydroxyl group; however, the acidic dyes are selected in consideration of necessary properties such as solubility with respect to an organic solvent or a developer, salt formation with a basic compound, light absorbance, interaction with other components in the curable composition, light resistance and heat resistance.

In the following, specific examples of the above acidic dyes are described. However, the present invention in not limited thereto. Examples include:

Acid Alizarin Violet N;

Acid Black 1, 2, 24 and 48;

Acid Blue 1, 7, 9, 15, 18, 23, 25, 27, 29, 40, 42, 45, 51, 62, 70, 74, 80, 83, 86, 87, 90, 92, 96, 103, 112, 113, 120, 129, 138, 147, 150, 158, 171, 182, 192, 210, 242, 243, 256, 259, 267, 278, 280, 285, 290, 296, 315, 324:1, 335 and 340;

Acid Chrome Violet K;

Acid Fuchsin;

Acid Green 1, 3, 5, 9, 16, 25, 27, 50, 58, 63, 65, 80, 104, 105, 106 and 109;

Acid Orange 6, 7, 8, 10, 12, 26, 50, 51, 52, 56, 62, 63, 64, 74, 75, 94, 95, 107, 108, 169 and 173;

Acid Red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 182, 183, 198, 206, 211, 215, 216, 217, 227, 228, 249, 252, 257, 258, 260, 261, 266, 268, 270, 274, 277, 280, 281, 195, 308, 312, 315, 316, 339, 341, 345, 346, 349, 382, 383, 394, 401, 412, 417, 418, 422 and 426;

Acid Violet 6B, 7, 9, 17 and 19;

Acid Yellow 1, 3, 7, 9, 11, 17, 23, 25, 29, 34, 36, 38, 40, 42, 54, 65, 72, 73, 76, 79, 98, 99, 111, 112, 113, 114, 116, 119, 123, 128, 134, 135, 138, 139, 140, 144, 150, 155, 157, 160, 161, 163, 168, 169, 172, 177, 178, 179, 184, 190, 193, 196, 197, 199, 202, 203, 204, 205, 207, 212, 214, 220, 221, 228, 230, 232, 235, 238, 240, 242, 243 and 251;

Direct Yellow 2, 33, 34, 35, 38, 39, 43, 47, 50, 54, 58, 68, 69, 70, 71, 86, 93, 94, 95, 98, 102, 108, 109, 129, 136, 138 and 141;

Direct Orange 34, 39, 41, 46, 50, 52, 56, 57, 61, 64, 65, 68, 70, 96, 97, 106 and 107;

Direct Red 79, 82, 83, 84, 91, 92, 96, 97, 98, 99, 105, 106, 107, 172, 173, 176, 177, 179, 181, 182, 184, 204, 207, 211, 213, 218, 220, 221, 222, 232, 233, 234, 241, 243, 246 and 250;

Direct Violet 47, 52, 54, 59, 60, 65, 66, 79, 80, 81, 82, 84, 89, 90, 93, 95, 96, 103 and 104;

Direct Blue 57, 77, 80, 81, 84, 85, 86, 90, 93, 94, 95, 97, 98, 99, 100, 101, 106, 107, 108, 109, 113, 114, 115, 117, 119, 137, 149, 150, 153, 155, 156, 158, 159, 160, 161, 162, 163, 164, 166, 167, 170, 171, 172, 173, 188, 189, 190, 192, 193, 194, 196, 198, 199, 200, 207, 209, 210, 212, 213, 214, 222, 228, 229, 237, 238, 242, 243, 244, 245, 247, 248, 250, 251, 252, 256, 257, 259, 260, 268, 274, 275 and 293;

Direct Green 25, 27, 31, 32, 34, 37, 63, 65, 66, 67, 68, 69, 72, 77, 79 and 82;

Mordant Yellow 5, 8, 10, 16, 20, 26, 30, 31, 33, 42, 43, 45, 46, 50, 61, 62 and 65;

Mordant Orange 3, 4, 5, 8, 12, 13, 14, 20, 21, 23, 24, 28, 29, 32, 34, 35, 36, 37, 42, 43, 47 and 48;

Mordant Red 1, 2, 3, 4, 9, 11, 12, 14, 17, 18, 19, 22, 23, 24, 25, 26, 30, 32, 33, 36, 37, 38, 39, 41, 43, 45, 46, 48, 53, 56, 63, 71, 74, 85, 86, 88, 90, 94 and 95;

Mordant Violet 2, 4, 5, 7, 14, 22, 24, 30, 31, 32, 37, 40, 41, 44, 45, 47, 48, 53 and 58;

Mordant Blue 2, 3, 7, 8, 9, 12, 13, 15, 16, 19, 20, 21, 22, 23, 24, 26, 30, 31, 32, 39, 40, 41, 43, 44, 48, 49, 53, 61, 74, 77, 83 and 84;

Mordant Green 1, 3, 4, 5, 10, 15, 19, 26, 29, 33, 34, 35, 41, 43 and 53;

Food Yellow 3; and derivatives of these dyes.

Among the above acidic dyes,

Acid Black 24;

Acid Blue 23, 25, 29, 62, 80, 86, 87, 92, 138, 158, 182, 243 and 324:1;

Acid Orange 8, 51, 56, 63 and 74;

Acid Red 1, 4, 8, 34, 37, 42, 52, 57, 80, 97, 114, 143, 145, 151, 183, 217 and 249;

Acid Violet 7;

Acid Yellow 17, 25, 29, 34, 42, 72, 76, 99, 111, 112, 114, 116, 134, 155, 169, 172, 184, 220, 228, 230, 232 and 243;

Acid Green 25; and derivatives of these dyes are preferable.

Further, other than the above, azo series, xanthene series and phthalocyanine series acidic dyes are preferable, and C.I. Solvent Blue 44 and 38; C.I. Solvent Orange 45; Rhodamine B; Rhodamine 110; 3-[(5-chloro-2-phenoxyphenyl)hydrazono]-3,4-dihydro-4-oxo-5-[(phenylsulfonyl)amino]-2,7-naphthalenedisulfonic acid or the like and derivatives of these acidic dyes may favorably be used.

Inorganic salts of acidic dyes having an acidic group such as a sulfonic group, carboxyl group or the like, salts of the acidic dye and a nitrogen-containing compound, sulfonamide derivatives of the acidic dyes, or the like, may be used as the above derivatives of the acidic dyes. The derivatives are not particularly limited as long as they can be dissolved to form a curable composition solution, but are selected in consideration of necessary properties such as solubility with respect to an organic solvent or a developer, light absorbance, interaction with other components in the curable composition, light resistance and heat resistance.

The above salts of an acidic dye and a nitrogen-containing compound are explained. There are cases when the method of forming a salt of an acidic dye and a nitrogen-containing compound is effective in improving the solubility of an acidic dye (imparting solubility with respect to an organic solvent) or in improving heat resistance and light resistance.

A nitrogen-containing compound that forms a salt with an acidic dye and a nitrogen-containing compound that forms an amide bond with an acidic dye are explained.

The nitrogen-containing compound is selected in consideration of the properties of the salt or amide compound such as the solubility with respect to an organic solvent or a developer, the salt formation, the light absorbance and chromatic valence of the dye, the interaction with other components in the curable composition, the light resistance and heat resistance as a colorant, and the like. When selected only in view of light absorbance and chromatic valence, it is preferable that the molecular weight of the nitrogen-containing compound is as low as possible, and among such nitrogen-containing compounds, those with a molecular weight of 300 or below are preferable, those with a molecular weight of 280 or below are more preferable, and those with a molecular weight of 250 or below are particularly preferable.

The molar ratio (referred to as "n" in the following) of the nitrogen-containing compound and the acidic dye (nitrogen-containing compound/acidic dye) in the salt of an acidic dye and a nitrogen-containing compound is explained. n is a value determined by the molar ratio of the acidic dye molecule and the amine compound as a counter ion, and may be freely selected in accordance with the conditions for acidic dye-amine compound salt formation. Specifically, a numerical value of $0<n\leq 5$ is commonly used with respect to the number of acidic functional groups in the acidic dye in practical applications, and is selected after consideration of necessary properties such as solubility with respect to an organic solvent or a developer, salt formation, light absorbance, interaction with other components in the curable composition, light resistance and heat resistance. When selected only in view of light absorbance, n is preferably a numerical value satisfying $0<n\leq 4.5$, more preferably a numerical value satisfying $0<n\leq 4$ and particularly preferably a numerical value satisfying $0<n\leq 3.5$.

Since the above acidic dyes are constituted as acidic dyes by the introduction of acidic groups into their structure, they may be made into non-acidic dyes by changing their substituents.

While there are cases where acidic dyes act favorably in alkaline development, there are also cases where over-development occurs, and cases where non-acidic dyes may be favorably used. Dyes such as the acidic dyes exemplified above but without an acidic group may be favorably used as the non-acidic dyes.

When these dyes compose complementary colors of yellow, magenta and cyan, dyes of the respective single colors are preferably used for each color, and when they compose primary colors of red, green and blue, a combination of two or more dyes is preferably used for each color. It is preferable to make up a primary color system by combining two or more dyes, for the dye that is soluble in an organic solvent.

When two or more of the above dyes soluble in an organic solvent are combined, it is preferable to use a mixture of at least two dyes having different absorption properties as the combination. An example of such absorption properties is the maximum absorption wavelength. In this case, for example, a combination of dyes having maximum absorption wavelengths that differ by 50 nm-250 nm is preferable, and a combination of dyes having maximum absorption wavelengths that differ by 50 nm-200 nm is more preferable.

Examples of a preferable combination of dyes soluble in an organic solvent include:

a combination of Valifast Yellow 1101 and Acid Red 57 (mass ratio 2:3);

a combination of Direct Yellow 33 and Direct Green 27 (mass ratio 2:3); and a combination of Mordant Violet 40 and Direct Green 69 (mass ratio 1:2).

The content amount of the colorant differs according to the colorant; however, in view of curability, developability, pattern formation, color mixture and the like, 0.5-90 mass % with respect to the total solid content in the composition is preferable, 10-80 mass % is more preferable, and 30-70 mass % is particularly preferable.

Photopolymerization Initiator (B)

The negative curable composition of the present invention includes at least one kind of photopolymerization initiator. The photopolymerization initiator is included in the negative curable composition of the present invention together with a radical-polymerizable monomer that is described in the following. As a result, the composition of the present invention can be configured as a negative composition. The photopolymerization initiator in the present invention is not particularly limited as long as it can be polymerized with the radical-polymerizable monomer, but is preferably selected in view of its properties, initiation efficiency, absorption wavelength, availability, cost and the like.

Examples of the photopolymerization initiator include at least one active halide selected from halomethyloxadiazole compounds and halomethyl-s-triazine compounds, 3-aryl substituted coumarin compounds, lophine dimers, benzophenone compounds, acetophenone compounds and derivatives thereof, cyclopentadiene-benzene-iron complexes and salts thereof, and oxime compounds.

Examples of an active halide that is a halomethyloxadiazole compound include 2-halomethyl-5-vinyl-1,3,4-oxadiazole compounds and the like as described in Japanese Patent Application Publication (JP-B) No. 57-6096, 2-trichloromethyl-5-styryl-1,3,4-oxadiazole, 2-trichloromethyl-5-(p-cyanostryryl)-1,3,4-oxadiazole and 2-trichloromethyl-5-(p-methoxystyryl)-1,3,4-oxadiazole.

Examples of an active halide that is a halomethyl-s-triazine compound include vinyl-halomethyl-s-triazine compounds as described in JP-B No. 59-1281, 2-(naphth-1-yl)-4,6-bis (halomethyl)-s-triazine compounds as described in JP-A No. 53-133428 and 4-(p-aminophenyl)-2,6-bis(halomethyl)-s-triazine compounds.

Specific examples of the halomethyl-s-triazine compounds include 2,4bis(trichloromethyl)-6-p-methoxystyryl-s-triazine, 2,6-bis(trichloromethyl)-4-(3,4-methylenedioxyphenyl)-1,3,5-triazine, 2,6-bis(trichloromethyl)-4-(4-methoxyphenyl)-1,3,5-triazine, 2,4-bis(trichloromethyl)-6-(1-p-dimethylaminophenyl-1,3-butadienyl)-s-triazine, 2-trichloromethyl-4-amino-6-p-methoxystyryl-s-triazine, 2-(naphth-1-yl)-4,6-bis(trichloromethyl)-s-triazine, 2-(4-methoxy-naphth-1-yl)-4,6-bis(trichloromethyl)-s-triazine, 2-(4-ethoxy-naphth-1-yl)-4,6-bis(trichloromethyl)-s-triazine, 2-(4-butoxy-naphth-1-yl)-4,6-bis(trichloromethyl)-s-triazine, 2-[4-(2-methoxyethyl)-naphth-1-yl]-4,6-bis(trichloromethyl)-s-triazine, 2-[4-(2-ethoxyethyl)-naphth-1-yl]-4,6-bis(trichloromethyl)-s-triazine, 2-[4-(2-butoxyethyl)-naphth-1-yl]-4,6-bis(trichloromethyl)-s-triazine, 2-(2-methoxy-naphth-1-yl)-4,6-bis(trichloromethyl)-s-triazine, 2-(6-methoxy-5-methyl-naphth-2-yl)-4,6-bis(trichloromethyl)-s-triazine, 2-(6-methoxy-naphth-2-yl)-4,6-bis(trichloromethyl)-s-triazine, 2-(5-methoxy-naphth-1-yl)-4,6-bis(trichloromethyl)-s-triazine, 2-(4,7-dimethoxy-naphth-1-yl)-4,6-bis(trichloromethyl)-s-triazine, 2-(6-ethoxy-naphth-2-yl)-4,6-bis(trichloromethyl)-s-triazine, 2-(4,5-dimethoxy-naphth-1-yl)-4,6-bis(trichloromethyl)-s-triazine, 4-[p-N,N-bis(ethoxycarbonylmethyl)aminophenyl]-2,6-bis(trichloromethyl)-s-triazine, 4-[o-methyl-p-N,N-bis(ethoxycarbonylmethyl)aminophenyl]-2,6-bis(trichloromethyl)-s-triazine, 4-[p-N,N-bis(chloroethyl)aminophenyl]-2,6-bis(trichloromethyl)-s-triazine, 4-[o-methyl-p-N,N-bis(chloroethyl)aminophenyl]-2,6-bis(trichloromethyl)-s-triazine, 4-(p-N-chloroethylaminophenyl)-2,6-bis(trichloromethyl)-s-triazine, 4-(p-N-ethoxycarbonylmethylaminophenyl)-2,6-bis(trichloromethyl)-s-triazine, 4-[p-N,N-bis(phenyl)aminophenyl]-2,6-bis(trichloromethyl)-s-triazine, 4-(p-N-chloroethylcarbonylaminophenyl)-2,6-bis(trichloromethyl)-s-triazine, 4-[p-N-(p-methoxyphenyl)carbonylaminophenyl]-2,6-bis(trichloromethyl)-s-triazine, 4-[m-N,N-bis(ethoxycarbonylmethyl)animophenyl]-2,6-bis(trichloromethyl)-s-triazine, 4-[m-bromo-p-N,N-bis(ethoxycarbonylmethyl)animophenyl]-2,6-bis(trichloromethyl)-s-triazine, 4-[m-chloro-p-N,N-bis(ethoxycarbonylmethyl)animophenyl]-2,6-bis(trichloromethyl)-s-triazine, 4-[m-fluoro-p-N,N-bis(ethoxycarbonylmethyl)animophenyl]-2,6-bis(trichloromethyl)-s-triazine, 4-[o-bromo-p-N,N-bis(ethoxycarbonylmethyl)animophenyl]-2,6-bis(trichloromethyl)-s-triazine, 4-[o-chloro-p-N,N-bis(ethoxycarbonylmethyl)animophenyl]-2,6-bis(trichloromethyl)-s-triazine, 4-[o-fluoro-p-N,N-bis(ethoxycarbonylmethyl)animophenyl]-2,6bis(trichloromethyl)-s-triazine, 4-[o-bromo-p-N,N-bis(chloroethyl)aminophenyl]-2,6-bis(trichloromethyl)-s-triazine, 4-[o-chloro-p-N,N-bis(chloroethyl)aminophenyl]-2,6-bis(trichloromethyl)-s-riazine, 4-[o-fluoro-p-N,N-bis(chloroethyl)aminophenyl]-2,6-bis(trichloromethyl)-s-triazine, 4-[m-bromo-p-N,N-bis(chloroethyl)aminophenyl]-2,6-bis(trichloromethyl)-s-triazine, 4-[m-chloro-p-N,N-bis(chloroethyl)aminophenyl]-2,6-bis(trichloromethyl)-s-triazine, 4-[m-fluoro-p-N,N-bis(chloroethyl)aminophenyl]-2,6-bis(trichloromethyl)-s-triazine, 4-(m-bromo-p-N-ethoxycarbonylmethylanimophenyl)-2,6-bis(trichloromethyl)-s-triazine, 4-(m-chloro-p-N-ethoxycarbonylmethylanimophenyl)-2,6-bis(trichloromethyl)-s-triazine, 4-(m-fluoro-p-N-ethoxycarbonylmethylanimophenyl)-2,6-bis(trichloromethyl)-s-triazine, 4-(o-bromo-p-N-ethoxycarbonylmethylanimophenyl)-2,6-bis(trichloromethyl)-s-triazine, 4-(o-chloro-p-N-ethoxycarbonylmethylanimophenyl)-2,6-bis(trichloromethyl)-s-triazine, 4-(o-fluoro-p-N-ethoxycarbonylmethylanimophenyl)-2,6-bis(trichloromethyl)-s-triazine, 4-(m-bromo-p-N-chloroethylaminophenyl)-2,6-bis(trichloromethyl)-s-triazine, 4-(m-chloro-p-N-chloroethylaminophenyl)-2,6-bis(trichloromethyl)-s-triazine, 4-(m-fluoro-p-N-chloroethylaminophenyl)-2,6-bis(trichloromethyl)-s-triazine, 4-(o-bromo-p-N-chloroethylaminophenyl)-2,6-bis(trichloromethyl)-s-triazine, 4-(o-chloro-p-N-chloroethylaminophenyl)-2,6-bis(trichloromethyl)-s-triazine, and 4-(o-fluoro-p-N-chloroethylaminophenyl)-2,6-bis(trichloromethyl)-s-triazine.

Other examples of the photopolymerization initiator that may be effectively used include the TAZ series produced by Midori Kagaku Co., Ltd. (for example, TAZ-107, TAZ-110, TAZ-104, TAZ-109, TAZ-140, TAZ-204 TAZ-113 and TAZ-123), the T series produced by Panchim Ltd. (for example, T-OMS, T-BMP, T-R and T-B), the IRGACURE® series (for example, IRGACURE 651, IRGACURE 184, IRGACURE 500, IRGACURE 1000, IRGACURE 149, IRGACURE 819 and IRGACURE 261) and DALOCURE® series (for example, DALOCURE 1173) produced by Ciba Specialty Chemicals, 4,4'-bis(diethylamino)-benzophenone, 2-(O-benzoyloxime)-1-[4-(phenylthio)phenyl]-1,2-octanedion, 1-(O-acetyloxime)-1-[9-ethyl-6-(2-methylbenzoyl)-9H-carbazol-3-yl]ethanone, 2-benzyl-2-dimethylamino-4-morpholinobutyrophenone, 2,2-dimethoxy-2-phenylacetophenone, 2-(o-chlorophenyl)-4,5-diphenylimidazolyl dimers, 2-(o-fluorophenyl)-4,5-diphenylimidazolyl dimers, 2-(o-methoxyphenyl)-4,5-diphenylimidazolyl dimers, 2-(p-methoxyphenyl)-4,5-diphenylimidazolyl dimers, 2-(p-dimethoxyphenyl)-4,5-diphenylimidazolyl dimers, 2-(2,4-dimethoxyphenyl)-4,5-diphenylimidazolyl dimers, 2-(p-methylmercaptophenyl)-4,5-diphenylimidazolyl dimers, and benzoin isopropyl ether.

Among these photopolymerization initiators, oxime compounds are preferable and, for example, 2-(O-benzoyloxime)-1-[4-(phenylthio)phenyl]-1,2-octanedion, and 1-(O-acetyloxime)-1-[9-ethyl-6-(2-methylbenzoyl)-9H-carbazol-3-yl]ethanone are particularly preferable.

Further, a sensitizer and a light stabilizer may be used together with these photopolymerization initiators.

Specific examples thereof include benzoin, benzoin methyl ether, 9-fluorenon, 2-chloro-9-fluorenon, 2-methyl-9-fluorenon, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, 2-ethoxyxanthone, thioxanthone, 2,4-diethylthioxanthone, acridone, 10-butyl-2-chloroacridone, benzyl, dibenzylacetone, p-(dimethylamino)phenylstyrylketone, p-(dimethylamino)phenyl-p-methylstyrylketone, benzophenone, p-(dimethylamino)benzophenone (or Michler's ketone), p-(diethylamino)benzophenone, benzoanthrone, benzothiazole compounds as disclosed in JP-B No. 51-48516, and TINUVIN 1130 and TINUVIN 400.

In addition to the above photopolymerization initiators, other known photopolymerization initiators may be used in the negative curable composition of the present invention.

Specific examples include vicinal polyketol aldonil compounds disclosed in U.S. Pat. No. 2,367,660, α-carbonyl compounds disclosed in U.S. Pat. Nos. 2,367,661 and 2,367,670, acyloin ether disclosed in U.S. Pat. No. 2,448,828, α-hydrocarbon-substituted aromatic acyloin compounds disclosed in U.S. Pat. No. 2,722,512, polynuclear quinone compounds disclosed in U.S. Pat. Nos. 3,046,127 and 2,951,758, combinations of triaryl imidazole dimers with p-aminophenyl ketone disclosed in U.S. Pat. No. 3,549,367 and combinations of benzothiazole compounds with trihalomethyl-s-triazine compounds disclosed in JP-B No. 51-48516.

The content amount of the photopolymerization initiator with respect to the solid content (mass) of the radical-polymerizable monomer described below is preferably from 0.01 mass % to 50 mass %, more preferably from 1 mass % to 30 mass %, and particularly preferably from 1 mass % to 20 mass %. When the content amount of the photopolymerization initiator is within the range of 0.01-50 mass %, polymerization can proceed without difficulty and film strength can be adequately improved.

Radical-Polymerizable Monomer (C)

The negative curable composition of the present invention includes at least one kind of radical-polymerizable monomer, and the content amount of the radical-polymerizable monomer with respect to the total solid content of the negative curable composition is 10-50 mass %. In the present invention, the content amount of the radical-polymerizable monomer is preferably 10-40 mass %.

If the content amount of the radical-polymerizable monomer is less than 10 mass %, the curability of the exposed portion may be insufficient, and if it is more than 50 mass %, the elutability of non-exposed portions may decrease.

The radical-polymerizable monomer used in the present invention is preferably a compound having at least one ethylenic double bond capable of addition polymerization and also having a boiling temperature under normal pressure of at least 100° C. Inclusion of the radical-polymerizable monomer together with the photopolymerization initiator described above enables the composition of the present invention to be configured as a negative composition.

Examples of the radical-polymerizable monomer include: monofunctional acrylates and methacrylates (hereinafter, referred to as (meth)acrylates) such as polyethylene glycol mono(meth)acrylate, polypropylene glycol mono(meth)acrylate and phenoxyethyl (meth)acrylate; polyethylene glycol di(meth)acrylate, trimethylol ethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol(meth)acrylate, trimethylol propane tris(acryloyloxypropyl)ether, tris(acryloyloxyethyl)isocyanurate; compounds that have been (meth)acrylated after addition of ethylene oxide or propylene oxide to polyfunctional alcohol such as glycerin or trimethylolethane; urethane acrylates such as those described in JP-B Nos. 48-41708 and 50-6034 and JP-A No. 51-37193; polyester acrylates described in JP-A No. 48-64183 and JP-B Nos. 49-43191 and 52-30490; and polyfunctional acrylates and methacrylates, and mixtures thereof, such as epoxy acrylates that are the product of a reaction between an epoxy resin and (meth)acrylic acid. Further examples include the substances presented as photocurable monomers and oligomers in the Journal of the Adhesion Society of Japan, Vol. 20, No. 7, pp. 300-308. Polyfunctional (meth)acrylic compounds are preferable as the radical-polymerizable monomer of the present invention.

Binder (D)

The negative curable composition of the present invention includes at least one kind of binder, and the content amount of the binder with respect to the total solid content of the negative curable composition is no more than 20 mass %. In the present invention, the content amount of the binder is preferably 0-10 mass % and is more preferably 0-5 mass %. If the content amount of the binder exceeds 20 mass %, sensitivity may be reduced and the adhesiveness to a support of a pattern formed on the support by the negative curable composition may also be reduced. That is to say, it is preferable to have a smaller amount of binder contained in the negative curable composition in view of the adhesiveness to the support of the pattern formed by the negative curable composition.

Known binders may be used as the binder in the present invention without particular limitation; however, the binder is preferably selected in view of heat resistance, developability, availability and the like.

A linear organic high molecular weight polymer that is soluble in an organic solvent and that can be used in development in a weak alkali aqueous solution is preferable as the binder. Examples of the linear organic high molecular weight polymer include polymers having a carboxyl group in a side chain, such as the methacrylic acid copolymers, acrylic acid copolymers, itaconic acid copolymers, crotonic acid copolymers, maleic acid copolymers, partially-esterified maleic acid copolymers and the like described in, for example, JP-A Nos. 59-44615, 59-53836 and 59-71048 and JP-B Nos. 54-34327, 58-12577 and 54-25957 and, similarly, acidic cellulose derivatives having a carboxyl group in a side chain may be used effectively.

Further, polymers having a hydroxyl group to which an acid anhydride has been added, polyhydroxystyrene resins, polysiloxane resins, poly(2-hydroxyethyl(meth)acrylate), polyvinyl pyrrolidone or polyethylene oxide, polyvinyl alcohol or the like may be used effectively as the binder of the present invention.

The linear organic high molecular weight polymer may be a copolymer including a monomer having hydrophilicity, examples of which include alkoxyalkyl (meth)acrylate, hydroxyalkyl (meth)acrylate, glycerol (meth)acrylate, (meth)acrylamide, N-methylol acrylamide, secondary or tertiary alkyl acrylamide, dialkyl aminoalkyl (meth)acrylate, morpholine (meth)acrylate, N-vinyl pyrrolidone, N-vinyl caprolactam, vinyl imidazole, vinyl triazole, methyl (meth)acrylate, ethyl (meth)acrylate, branched or straight chain propyl (meth)acrylate, branched or straight chain butyl (meth)acrylate, and phenoxyhydroxypropyl (meth)acrylate.

In addition, monomers that include a tetrahydrofurfuryl group, phosphoric acid, phosphoric acid ester, a quaternary ammonium salt, an ethyleneoxy chain, a propyleneoxy chain, sulfonic acid and salts thereof, a morpholinoethyl group, and the like may be effectively used as the monomer having hydrophilicity.

The binder in the present invention may have a polymerizable group in a side chain in order to improve cross-linking efficiency and, for example, polymers containing an aryl group, a (meth)acryl group, an aryloxyalkyl group or the like in a side chain may be effectively used. Examples of the polymers containing a polymerizable group include the commercial products KS Resist 106 (manufactured by Osaka Organic Chemical Industry Ltd.) and the Cyclomer-P series (manufactured by Daicel Chemical Industries, Ltd.). Further, an alcohol-soluble nylon, a polyether of 2,2-bis-(4-hydroxyphenyl)-propane and epichlorohydrin, or the like may be effectively used in order to increase the strength of the cured film.

Among these respective kinds of binder, polyhydroxystyrene resins, polysiloxane resins, acrylic resins, acrylamide resins, and acrylic/acrylamide copolymer resins are preferable in view of heat resistance, and acrylic resins, acrylamide resins, and acrylic/acrylamide copolymer resins are preferable in view of developability control.

Copolymers formed from monomers selected from, for example, benzyl (meth)acrylate, (meth)acrylic acid, hydroxyethyl (meth)acrylate and (meth)acrylamide, or the commercial products KS Resist 106 (manufactured by Osaka Organic Chemical Industry Ltd.), the Cyclomer-P series (manufactured by Daicel Chemical Industries, Ltd.) or the like are preferable as the above acrylic resins.

In view of developability, liquid viscosity and the like, a polymer having a weight-average molecular weight (being a polystyrene equivalent value measured by the GPC method) of from 1000 to $2 \times 10^5$ is preferable, a polymer having a weight-average molecular weight of from 2000 to $1 \times 10^5$ is more preferable, and a polymer having a weight-average molecular weight of from 5000 to $5 \times 10^4$ is particularly preferable as the binder.

Monofunctional thiol Compound (E)

The negative curable composition of the present invention includes at least one kind of monofunctional thiol compound. This results in excellent sensitivity and developability and enables provision of a negative curable composition that enables formation of a rectangular fine pattern.

Generally, in the exposure process in a pattern formation process, there are cases when the exposure at a deep portion in a layer is insufficient compared to that of a surface part of the layer. As a result, there is a tendency toward excessive developability particularly in a low binder content formulation in which the amount of the binder is low compared to the content of the radical-polymerizable monomer, and a problem may arise whereby the base of the pattern after development becomes undesirably narrow. By including a monofunctional thiol compound in the negative curable composition of the present invention, it becomes possible not only to increase sensitivity in a low binder content formulation but also to suppress the occurrence of base-narrowing of the pattern after development, enabling formation of a highly rectangular fine pattern.

Further, since a film thickness of 1.5 μm or below is required in the case of use in the production of a color filter for a solid-state image sensor, a large amount of colorant must be added to the curable composition, as a result of which there has been a tendency toward insufficient adhesion to a substrate; however, adhesion between the pattern and the substrate can be improved as a result of the inclusion of a monofunctional thiol compound. In addition, use of a monofunctional thiol compound results in excellent storage stability over the long-term, and these effects are either far superior in comparison to those exhibited by a polyfunctional thiol compound, or are simply not evident with a polyfunctional thiol compound.

The content of the monofunctional thiol compound included in the present invention is preferably from 0.1 to 20 mass % with respect to the total solid content of the negative curable composition, and more preferably from 1 to 20 mass %. When the content of the monofunctional thiol compound is within the range of 0.1 to 20 mass %, favorable curability of the exposed portion can be achieved, the elutability of the non-exposed portion is high and the negative curable composition has excellent storage stability.

In addition, the content of the monofunctional thiol compound in the present invention is preferably less than the content of the above radical-polymerizable monomer. This enables the sensitivity of the negative curable composition of the present invention, and the adhesiveness of the pattern to the substrate, to be increased.

The monofunctional thiol compound as described in the present invention refers to a compound that only includes one thiol group in the molecule. A low molecular compound with a molecular weight of 100 or above is preferable as the above monofunctional thiol compound in view of nonvolatility and diffusivity within the film. Specifically, a molecular weight of 100-1500 is preferable, and a molecular weight of 150-1000 is more preferable.

Further, the monofunctional thiol compound may also have substituent group(s) other than the thiol group.

Specific examples of the monofunctional thiol compound in the present invention include 1-hexane thiol, 1-octane thiol, 2-methyl-1-butane thiol, 2-methyl-2-butane thiol, aryl mercaptan, cyclohexyl mercaptan, thiophenol, phenethyl mercaptan, 2-ethyl thiophenol, 4-methoxybenzothiophenol, 2-naphthalene thiol, mercaptoimidazole, mercaptooxazole, mercaptothiazole, mercaptotriazole, mercaptothiadiazole, mercaptooxadiazole, mercaptobenzoimidazole, mercaptobenzoxazole, mercaptobenzothiazole and derivatives thereof.

Among these, mercaptoimidazole, mercaptooxazole, mercaptothiazole, mercaptotriazole, mercaptothiadiazole, mercaptobenzoimidazole, mercaptobenzoxazole, mercaptobenzothiazole and heterocyclic monofunctional thiol compounds of derivatives thereof are preferable, and N-phenyl mercaptobenzoimidazole, 2-mercapto-5-methylthio-1,3,4-thiadiazole, 2-mercapto-5-methoxyethylthio-1,3,4-thiadiazole, and 5-hexanoxyethoxy-2-mercapto-6-methyl-1,3-benzoxazole are particularly preferable.

In the present invention, the following combination of the colorant, the radical-polymerizable monomer, the binder and the monofunctional thiol compound in terms of respective content is preferable: the content of the colorant (A) is 20-80 mass % with respect to the total solid content; the content of the radical-polymerizable monomer (C) is 10-50 mass % with respect to the total solid content; the content of the binder (D) is 0-20 mass % with respect to the solid content; and the content of the monofunctional thiol compound (E) is 1-20 mass % with respect to the solid content. When the respective content amounts are within the above ranges, it is possible to improve sensitivity and the rectangularity of the obtained pattern, and a negative curable composition having excellent adhesion between the pattern and the substrate and having excellent storage stability can be obtained.

Further, in the present invention, it is preferable that the colorant is a dye that is soluble in an organic solvent, the radical-polymerizable monomer is a polyfunctional (meth) acrylic compound, and the monofunctional thiol compound is a heterocyclic thiol compound. As a result, it is possible to improve sensitivity and the rectangularity of the obtained pattern, and a negative curable composition having excellent adhesion between the pattern and the substrate and having excellent storage stability can be obtained.

Cross-Linking Agent

In the present invention, a cross-linking agent may be used to obtain a more highly cured film. The cross-linking agent is explained in the following.

The cross-linking agent that may be used in the present invention is not particularly limited as long as film curing may be performed by means of the cross-linking reaction, and examples thereof include (a) an epoxy resin, (b) a melamine compound, guanamine compound, glycoluril compound or urea compound substituted by at least one selected from a methylol group, an alkoxymethyl group and an acyloxymethyl group, and (c) a phenol compound, naphthol compound, or hydroxyanthracene compound substituted by at least one selected from a methylol group, an alkoxymethyl group and an acyloxymethyl group. Among these, an epoxy resin is preferable and a polyfunctional epoxy resin is particularly preferable.

The above (a) epoxy resin may be any epoxy resin as long as it has an epoxy group and a cross-linking property. Examples thereof include: bivalent glycigyl group-containing low molecular compounds such as bisphenol A diglycidyl ether, ethylene glycol diglycidyl ether, butanediol diglycidyl ether, hexanediol diglycidyl ether, dihydroxy biphenyl diglycidyl ether, phthalic acid diglycidyl ester or N,N-diglycidyl aniline; trivalent glycidyl group-containing low molecular compounds represented by trimethylol propane triglycidyl ether, trimethylol phenol triglycidyl ether, TrisP-PA triglycidyl ether or the like; quadrivalent glycidyl group-containing low molecular compounds represented by pentaerythritol tetraglycidyl ether, tetramethylol bisphenol A tetraglycidyl ether, or the like; polyvalent glycidyl group-containing low molecular compounds such as dipentaerythritol pentaglycidyl ether, or dipentaerythritol hexaglycidyl ether; and glycidyl group-containing high molecular compounds represented by polyglycidyl (meth)acrylate, a 1,2-epoxy-4-(2-oxylanyl)cyclohexane adduct of 2,2-bis(hydroxymethyl)-1-butanol, or the like.

The number of sites substituted by a methylol group, alkoxymethyl group or acyloxymethyl group in the above cross-linking agent (b) is preferably from 2 to 6 in a melamine compound and from 2 to 4 in a glycoluryl compound, guanamine compound or urea compound, and is more preferably from 5 to 6 in a melamine compound and from 3 to 4 in a glycoluryl compound, guanamine compound or urea compound.

In the following, the melamine compound, guanamine compound, glycoluryl compound and urea compound of (b) above are collectively referred to as the compound according to (b) containing a (methylol group, alkoxymethyl group or acyloxymethyl group).

The compound containing a methylol group according to (b) can be obtained by heating the compound containing an alkoxymethyl group according to (b) in alcohol in the presence of an acid catalyst such as hydrochloric acid, sulfuric acid, nitric acid or methanesulphonic acid. The compound containing an acyloxymethyl group according to (b) can be obtained by mixing and stirring the compound containing a methylol group according to (b) with acyl chloride in the presence of a basic catalyst.

Specific examples of the above compound having a substituent group according to (b) are given in the following.

Examples of the melamine compound include hexamethylol melamine, hexakis(methoxymethyl)melamine, a compound in which 1 to 5 methylol groups in hexamethylol melamine have been methoxymethylated, mixtures thereof, hexakis(methoxyethyl)melamine, hexakis(acyloxymethyl) melamine, a compound in which 1 to 5 methylol groups in hexamethylol melamine have been acyloxymethylated, and mixtures thereof.

Examples of the guanamine compound include tetramethylol guanamine, tetrakis(methoxymethyl)guanamine, a compound in which 1 to 3 methylol groups in tetramethylol guanamine have been methoxymethylated, mixtures thereof, tetrakis(methoxyethyl) guanamine, tetrakis(acyloxymethyl) guanamine, a compound in which 1 to 3 methylol groups in tetramethylol guanamine have been acyloxymethylated, and mixtures thereof.

Examples of the glycoluryl compound include tetramethylol glycoluryl, tetrakis(methoxymethyl)glycoluryl, a compound in which 1 to 3 methylol groups in tetramethylol glycoluryl have been methoxymethylated, mixtures thereof, a compound in which 1 to 3 methylol groups in tetramethylol glycoluryl have been acyloxymethylated, and mixtures thereof.

Examples of the urea compound include tetramethylol urea, tetrakis(methoxymethyl)urea, a compound in which 1 to 3 methylol groups in tetramethylol urea have been methoxymethylated, mixtures thereof, and tetrakis(methoxyethyl) urea.

These compounds according to (b) may be used singly or in combination.

The above cross-linking agent (c), that is, the phenol compound, naphthol compound or hydroxyanthracene compound substituted by at least one selected from a methylol group, an alkoxymethyl group and an acyloxymethyl group, suppresses intermixing of a film with an overcoated photoresist, and also further increases the strength of the film, as a result of heat cross-linking, similarly to the above cross-linking agent (b). In the following, these compounds are collectively referred to as the compound (containing a methylol group, alkoxymethyl group or acyloxymethyl group) according to (c).

The number of methylol groups, alkoxymethyl groups and acyloxymethyl groups included in the above cross-linking agent (c) needs to be at least two per molecule, and when a phenol compound forms the skeleton, a compound having both second and fourth positions substituted is preferable in view of heat cross-linkability and storage stability.

Further, when a naphthol compound or hydroxyanthracene compound forms the skeleton, a compound having all ortho and para positions with respect to the OH group substituted is preferable.

In the phenol compound, the third and fifth positions either may not be substituted or may have substituent groups.

In the naphthol compound, positions other than the ortho positions with respect to the OH group either may not be substituted or may have substituent groups.

The compound containing a methylol group according to (c) can be obtained by using as a precursor a compound in which the second or fourth position with respect to the phenolic OH group is a hydrogen atom, and reacting this with formalin in the presence of a basic catalyst such as sodium hydroxide, potassium hydroxide, ammonia or tetra-alkyl ammonium hydroxide.

The compound containing an alkoxymethyl group according to (c) can be obtained by heating the compound containing a methylol group according to (c) in the presence of an acid catalyst such as hydrochloric acid, sulfuric acid, nitric acid or methanesulphonic acid.

The compound containing an acyloxymethyl group according to (c) can be obtained by reacting the compound containing a methylol group according to (c) with acyl chloride in the presence of a basic catalyst.

Examples of the skeleton compound in the cross-linking agent (c) include a phenol, naphthol, or an hydroxyanthracene compound having either the ortho position or the para position with respect to the phenolic OH group not substituted and, for example, isomers of phenol or cresol, bisphenols such as 2,3-xylenol, 2,5-xylenol, 3,4-xylenol, 3,5-xylenol or bisphenol A, or 4,4'-dibishydroxybiphenyl, TrisP-PA (manufactured by Honshu Chemical Industry Co., Ltd.), naphthol, dihydroxynaphthalene, 2,7-dihydroxyanthracene or the like, may be used.

Specific examples of the cross-linking agent (c) include, as the phenol compound, trimethylol phenol, tris(methoxymethyl)phenol, a compound in which 1 or 2 methylol groups in trimethylol phenol have been methoxymethylated, trimethylol-3-cresol, tris(methoxymethyl)-3-cresol, a compound in which 1 or 2 methylol groups in trimethylol-3-cresol have been methoxymethylated, dimethylol cresols such as 2,6-dimethylol-4-cresol, tetramethylol bisphenol A, tetrakis (methoxymethyl)bisphenol A, a compound in which 1 to 3 methylol groups in tetramethylol bisphenol A have been methoxymethylated, tetramethylol-4,4'-dihydroxybiphenyl, tetramethoxymethyl-4,4'-dihydroxybiphenyl, hexamethylol derivatives of TrisP-PA, hexamethoxymethyl derivatives of TrisP-PA, a compound in which 1 to 5 methylol groups in a hexamethylol derivatives of TrisP-PA have been methoxymethylated, and bishydroxymethyl naphthalene diol.

Further, examples of the hydroxyanthracene compound include 1,6-bis(hydroxymethyl)-2,7-dihydroxyanthracene, and examples of the compound containing an acyloxymethyl group include a compound in which either some or all of the methylol groups in the above compound containing a methylol group have been acyloxymethylated.

Preferable examples of these compounds include trimethylol phenol, bishydroxymethyl-p-cresol, tetramethylol bisphenol A, hexamethylol derivatives of TrisP-PA (manufactured by Honshu Chemical Industry Co., Ltd.), and phenol compounds in which all or some of the methylol groups in any of these compounds are substituted by alkoxymethyl groups.

These compounds according to (c) may be used either singly or in combination thereof.

The total content of the cross-linking agent in the negative curable composition of the present invention differs according to the material, but is preferably 1-70 mass %, more preferably 5-50 mass % and particularly preferably 7-30 mass % with respect to the solid content (mass) of the curable composition, in view of improving curability.

Thermal polymerization inhibitor

In addition to the above, the negative curable composition of the present invention preferably also has a thermal polymerization inhibitor added thereto. For example, hydroquinone, p-methoxy phenol, di-t-butyl-p-cresol, pyrogallol, t-butyl cathecol, benzoquinone, 4,4'-thiobis(3-methyl-6-t-butylphenol), or 2,2'-methylenebis(4-methyl-6-t-butylphenol) may be used.

Organic Solvent

Organic solvents that may be used in the present invention are essentially not particularly limited as long as the solubility of respective components and the coating properties of the negative curable composition are satisfied; however, the organic solvent is preferably selected after consideration of the solubility, coating properties and safety of the dye and binder in particular. Further, it is preferable to include at least two kinds of organic solvent when preparing the negative curable composition of the present invention.

Preferable examples of the organic solvent include esters such as ethyl acetate, n-butyl acetate, isobutyl acetate, amyl formate, isoamyl acetate, butyl propionate, isopropyl butyrate, ethyl butyrate, butyl butyrate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, and the like;

methyl 3-oxypropionate, ethyl 3-oxypropionate, methyl 3-methoxypropionate, ethyl 3-methoxypropionate, methyl 3-ethoxypropionate, ethyl 3-ethoxypropionate, and the like; methyl 2-oxypropionate, ethyl 2-oxypropionate, propyl 2-oxypropionate and the like; methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, and the like; methyl pyruvate, ethyl pyruvate, propyl pyruvate, methyl acetoacetate, ethyl acetoacetate, methyl 2-oxobutanate, ethyl 2-oxobutanate, and the like;

ethers such as diethylene glycol dimethyl ether, tetrahydrofuran, ethylene glycol monomethyl ether, ethylene glycol monoethyl ether, methyl cellosolve acetate (ethylene glycol monomethyl ether acetate), ethyl cellosolve acetate (ethylene glycol monoethyl ether acetate), diethylene glycol monomethyl ether, diethylene glycol monoethyl ether, diethylene glycol monobutyl ether, ethyl carbitol acetate (diethylene glycol monoethyl ether acetate), butyl carbitol acetate (diethylene glycol monobutyl ether acetate), propylene glycol monomethyl ether, propylene glycol monomethyl ether acetate, propylene glycol monoethyl ether acetate, propylene glycol monopropyl ether acetate, and the like;

ketones such as methyl ethyl ketone, cyclohexanone, 2-heptanone, 3-heptanone, and the like; and aromatic hydrocarbons such as toluene, xylene and the like.

As described above, in view of the solubility of the colorant and the binder, improvement of the coating surface shape and the like, two or more of these organic solvents may be mixed and, in particular, a mixed solution composed of two or more selected from the above methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol monomethyl ether and propylene glycol monomethyl ether acetate may be favorably used.

The amount of organic solvent used in the present invention is preferably 5-80 mass % with respect to the total solid content of the negative curable composition of the present invention, more preferably 5-60 mass %, and particularly preferably 10-50 mass % in view of coating properties.

Additives

Various additives such as fillers, high-molecular compounds other than those described above, surfactants, adhesion promoters, antioxidants, ultraviolet absorbers, and anticoagulants may be incorporated into the negative curable composition of the present invention as necessary.

Specific examples of the above additives include fillers such as glass and alumina; high-molecular compounds that are not binder resins, such as polyvinyl alcohol, polyacrylic acid, polyethylene glycol monoalkyl ether and polyfluoroalkyl acrylate; nonionic, cationic and anionic surfactants, and the like; adhesion promoters such as vinyl trimethoxysilane, vinyl triethoxysilane, vinyl tris(2-methoxyethoxy)silane, N-(2-aminoethyl)-3-aminopropyl methyl dimethoxysilane, N-(2-aminoethyl)-3-aminopropyl trimethoxysilane, 3-aminopropyl triethoxysilane, 3-glycidoxypropyl trimethoxysilane, 3-glycidoxypropyl methyl dimethoxysilane, 2-(3,4-epoxycyclohexyl)ethyl trimethoxysilane, 3-chloropropyl methyl dimethoxysilane, 3-chloropropyl trimethoxysilane, 3-methacryloxypropyl trimethoxysilane and 3-mercaptopropyl trimethoxysilane; antioxidants such as 2,2-thiobis(4-methyl-6-t-butylphenol) and 2,6-di-t-butyl phenol; ultraviolet absorbers such as 2-(3-t-butyl-5-methyl-2-hydroxyphenyl)-5-chlorobenzotriazole and alkoxybenzophenone; and anticoagulants such as sodium polyacrylate.

Further, an organic carboxylic acid, preferably a low molecular weight organic carboxylic acid having a molecular weight of 1000 or less, can be added to the negative curable composition of the present invention in order to promote the alkali solubility of the non-image portion and further improve the developability of the composition.

Specific examples include aliphatic monocarboxylic acids such as formic acid, acetic acid, propionic acid, butyric acid, valeric acid, pivalic acid, caproic acid, diethyl acetic acid, enanthic acid and caprylic acid; aliphatic dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid and citraconic acid; aliphatic tricarboxylic acids such as tricarballylic acid, aconitic acid and camphoronic acid; aromatic monocarboxylic acids such as benzoic acid, toluic acid, cuminic acid, hemellitic acid and mesitylenic acid; aromatic polycarboxylic acids such as phthalic acid, isophthalic acid, terephthalic acid, trimellitic acid, trimesic acid, Mellophanic acid and pyromellitic acid; and other carboxylic acids such as phenyl acetic acid, hydratropic acid, hydrocinnamic acid, mandelic acid, phenylsuccinic acid, atropic acid, cinnamic acid, cinnamylidene acetic acid, Coumaric acid, and Umbellic acid.

Color Filter and Method of Production Thereof

Next, the color filter of the present invention is described in detail by means of a description of the method of production thereof.

The negative curable composition of the present invention described in the foregoing is used in the method of producing a color filter of the present invention.

The negative curable composition of the present invention is coated onto a support by a coating method such as spin coating, flow coating or roll coating to form a negative curable composition layer, the layer is exposed via a given mask pattern and developed with a developer, whereby a negative color pattern is formed on the support (image formation process). Further, if necessary, a curing process of curing the formed color pattern by heating and/or exposure may be included.

Exposure of the negative curable composition of the present invention may be performed by any of proximity exposure, mirror projection exposure or stepper exposure, but it is particularly preferable to perform exposure according to the stepper method (a reduced projection exposure method using a reduced projection exposure device). The stepper method forms a pattern by performing exposure while gradually varying the exposure amount, and the rectangularity of the pattern, which is one of the effects of the present invention, can be made particularly favorable when performing stepper exposure.

Further, an i-ray Stepper (product name: FPA-3000i5+; manufactured by Canon Inc.) or the like may be used as the exposure device used in the stepper exposure.

In the production of a color filter, a color filter composed of intended hues can be produced by repeating the above image formation process (and, as necessary, the curing process) for the number of times corresponding to the number of intended hues. Ultraviolet rays such as g-rays, h-rays and i-rays are preferably used as the light or radiation used at this time.

Examples of the above support include soda glass, borosilicate glass (such as Pyrex (registered trademark) glass) and silica glass and the like used in liquid crystal display elements and the like, and any of these having a transparent conductive coating added thereto; photoelectrical conversion element substrates used in image sensors and the like, such as a silicon substrate or the like; and complementary metal oxide film semiconductors (CMOS). In certain cases, these substrates may be formed with black stripes separating respective pixels.

Further, an undercoating layer may be provided on these supports, as necessary, for the purpose of improved adhesiveness with the upper layer, prevention of diffusion of materials, and planarization of the substrate surface.

Any developer may be used as long as it is formed of a composition that both dissolves an uncured portion of the negative curable composition of the present invention and does not dissolve an irradiated portion. Specifically, alkaline aqueous solutions or combinations of various organic solvents may be used. Examples of the organic solvents include the organic solvents described above that are used when preparing the negative curable composition of the present invention.

Favorable examples of the alkaline aqueous solution include alkaline aqueous solutions formed by dissolving alkaline compounds such as sodium hydroxide, potassium hydroxide, sodium carbonate, sodium silicate, sodium metasilicate, ammonia water, ethylamine, diethylamine, dimethyl ethanol amine, tetramethyl ammonium hydroxide, tetraethyl ammonium hydroxide, choline, pyrrole, piperidine and 1,8-diazabicyclo-[5.4.0]-7-undecene to a density of from 0.001 to 10 mass %, preferably from 0.01 to 1 mass %. In addition, when a developer formed from this kind of alkaline aqueous solution is used, washing with water is generally performed after development.

The color filter of the present invention can be used in liquid crystal display elements and solid state image sensors such as CCDs and, in particular, is favorably used in high resolution CCDs, CMOS and the like having more than one million pixels. The color filter of the present invention can be used, for example, as a color filter disposed between the light receiving portion of respective pixels configuring a CCD and a microlens for focusing light.

EXAMPLES

In the following, the present invention is explained in further detail using examples; however, the present invention is not limited to the following examples as long as it does not exceed the main essence of the invention. In addition, unless otherwise indicated, "parts" and "percent" refer to the mass standard.

Example 1

1) Preparation of Negative Curable Composition

The following compounds were mixed and dissolved according to the composition indicated, and the negative curable composition of the present invention was prepared. Composition

| Composition | |
|---|---|
| Cyclohexanon (organic solvent) | 26 g |
| Binder (D) (Resin A) | 2.0 g |
| (Copolymer of benzyl methacrylate and methacrylic acid (at a molar ration of 80/20)) | |
| Radical-polymerizable monomer (C) (Monomer A) | 3.0 g |
| (Radical-polymerizable monomer: dipentaerythritol hexaacrylate) | |
| Photopolymerization initiator (B) | 0.5 g |
| (Product name: TAZ-107; manufactured by Midori Kagaku Co., Ltd.) | |
| Colorant (A) (dye soluble in organic solvent) | 3.0 g |
| (Valifast yellow 1101) | |
| Monofunctional thiol compound (E) | 0.5 g |
| (2-mercapto-5-methylthio-1,3,4-thiadiazole: MMT) | |

2) Production of Glass Substrate with Undercoat Layer Applied thereon

A glass substrate (support; product name: Corning 1737; manufactured by Corning Inc.) was ultrasonically cleaned with 1% NaOH water and then rinsed with water and baked at 220° C. for 30 minutes to remove water. After this, a resist solution (product name: CT-2010L; manufactured by FUJIFILM Electronic Materials Co., Ltd.) was coated onto the washed glass substrate at a film thickness of 1 μm using a spincoater (1H-D7; manufactured by Mikasa Co., Ltd.) and dried by heating at 220° C. for 1 hour to form a cured film (undercoat layer).

3) Exposure and Development of Negative Curable Composition (Image Formation Process)

The negative curable composition obtained in 1) above was coated onto the undercoat layer on the undercoated glass substrate obtained in 2) above at a film thickness of 1 μm using a spincoater and prebaked at 100° C. for 120 seconds, to produce a sample having a resist layer (negative curable composition layer) formed on the support.

Examples 2-32

Negative curable compositions were prepared and samples produced in the same manner as in Example 1 except that the respective compositions were altered with respect to Example 1 as shown in the following Table 1 and Table 2.

Comparative Examples 1-6

Negative curable compositions for comparison were prepared and samples prepared in the same manner as in Example 1 except that the respective compositions included in the negative curable composition were altered with respect to Example 1 as shown in the following Table 2.

4) Production and Evaluation of Color Filter (1) Production of Color Filter and Evaluation of Sensitivity The resist layers of the samples produced in the respective Examples and Comparative Examples were irradiated at a wavelength of 365 nm through a mask of 1.5 μm length and 1.5 μm width using an i-ray reduced projection exposure device (product name: FPA-3000i5+; manufactured by Canon Inc.) with the light exposure amount varied. After irradiation, development was performed at 23° C. for 60 seconds using a developer (product name: CD-2060; manufactured by FUJIFILM Electronic Materials Co., Ltd.). Subsequently, a pattern was formed after rinsing with running water for 20 seconds and spray drying, and a color filter was obtained. The image formation was confirmed according to the normal method using an optical microscope and observation of SEM photography.

Here, the light exposure amount is set at an appropriate level so that the width of the pixel pattern of 1.5 μm length and 1.5 μm width and the width of the space between the pixel patterns correspond at a ratio of 1:1, and this light exposure amount is taken as the sensitivity. The lower the numerical value, the higher and more preferable the sensitivity is. The results are shown in the following Table 1 and Table 2.

(2) Profile

A pattern cross-section of an SEM image of the pixel pattern formed at the appropriate exposure amount as defined in (1) above was observed. Patterns with a favorable rectangular profile are evaluated with the grade "A", those with a slight reverse taper (i.e., having a thin base) are evaluated with the grade "B", those with a pronounced reverse taper, "C", those with impaired development or development residue, "D", and those that could not form a pattern and could not be evaluated are given the grade "E". The results are shown in Table 1 and Table 2.

TABLE 1

| | Binder | Radical-polymerizable monomer | Colorant | Photo-polymerization initiator | Thiol compound | Organic solvent | Sensitivity (mJ/cm$^2$) | Profile |
|---|---|---|---|---|---|---|---|---|
| Example 1 | Resin A (2.0 g) | Monomer A (3.0 g) | Varifast Yellow 1101 (4.0 g) | TAZ-107 (0.5 g) | MMT (0.5 g) | Cyclohexanone (26 g) | 400 | A |
| Example 2 | Resin A (2.0 g) | Monomer A (3.0 g) | Varifast Yellow 1101 (4.0 g) | Oxime A (0.5 g) | MMT (0.5 g) | Cyclohexanone (26 g) | 300 | A |
| Example 3 | Resin A (2.0 g) | Monomer A (3.0 g) | Varifast Yellow 1101 (4.0 g) | Oxime B (0.5 g) | MMT (0.5 g) | Cyclohexanone (26 g) | 250 | A |
| Example 4 | Resin A (2.0 g) | Monomer A (3.0 g) | Varifast Yellow 1101 (4.0 g) | TAZ-107 (0.5 g) | MMT (0.5 g) | Ethyl lactate (26 g) | 400 | A |
| Example 5 | Resin A (2.0 g) | Monomer A (3.0 g) | Varifast Yellow 1101 (4.0 g) | Oxime A (0.5 g) | MMT (0.5 g) | Ethyl lactate (26 g) | 300 | A |
| Example 6 | Resin A (2.0 g) | Monomer A (3.0 g) | Varifast Yellow 1101 (4.0 g) | Oxime A (0.5 g) | MMT (0.5 g) | Ethyl lactate (26 g) | 250 | A |
| Example 7 | Resin A (2.0 g) | Monomer A (3.0 g) | Varifast Yellow 1101 (4.0 g) | TAZ-107 (0.5 g) | HMMBO (0.5 g) | Cyclohexanone (26 g) | 500 | A |
| Example 8 | Resin A (2.0 g) | Monomer A (3.0 g) | Varifast Yellow 1101 (4.0 g) | Oxime A (0.5 g) | HMMBO (0.5 g) | Cyclohexanone (26 g) | 450 | A |
| Example 9 | Resin A (2.0 g) | Monomer A (3.0 g) | Varifast Yellow 1101 (4.0 g) | TAZ-107 (0.5 g) | ETPh (0.5 g) | Cyclohexanone (26 g) | 700 | B |
| Example 10 | Resin A (2.0 g) | Monomer A (3.0 g) | Varifast Yellow 1101 (4.0 g) | Oxime A (0.5 g) | ETPh (0.5 g) | Cyclohexanone (26 g) | 600 | B |
| Example 11 | Resin A (2.0 g) | Monomer A (3.0 g) | Varifast Yellow 1101 (4.0 g) | TAZ-107 (0.5 g) | NPhMBI (0.5 g) | Cyclohexanone (26 g) | 500 | A |
| Example 12 | Resin A (2.0 g) | Monomer A (3.0 g) | Varifast Yellow 1101 (4.0 g) | Oxime A (0.5 g) | NPhMBI (0.5 g) | Cyclohexanone (26 g) | 400 | A |
| Example 13 | Resin A (2.0 g) | Monomer A (3.0 g) | Varifast Yellow 1101 (4.0 g) | TAZ-107 (0.5 g) | MMET (0.5 g) | Cyclohexanone (26 g) | 400 | A |
| Example 14 | Resin A (2.0 g) | Monomer A (3.0 g) | Varifast Yellow 1101 (4.0 g) | Oxime A (0.5 g) | MMET (0.5 g) | Cyclohexanone (26 g) | 300 | A |
| Example 15 | Resin A (1.0 g) | Monomer A (4.0 g) | Varifast Yellow 1101 (4.0 g) | TAZ-107 (0.5 g) | MMT (0.5 g) | Cyclohexanone (26 g) | 350 | A |
| Example 16 | Resin A (0.55 g) | Monomer A (4.45 g) | Varifast Yellow 1101 (4.0 g) | TAZ-107 (0.5 g) | MMT (0.5 g) | Cyclohexanone (26 g) | 350 | A |
| Example 17 | | Monomer A (5.0 g) | Varifast Yellow 1101 (4.0 g) | TAZ-107 (0.5 g) | MMT (0.5 g) | Cyclohexanone (26 g) | 300 | A |
| Example 18 | | Monomer A (5.0 g) | Varifast Yellow 1101 (4.0 g) | Oxime A (0.5 g) | MMT (0.5 g) | Cyclohexanone (26 g) | 250 | A |
| Example 19 | | Monomer A (5.0 g) | Varifast Yellow 1101 (4.0 g) | Oxime B (0.5 g) | MMT (0.5 g) | Cyclohexanone (26 g) | 200 | A |
| Example 20 | | Monomer A (5.0 g) | Varifast Yellow 1101 (4.0 g) | TAZ-107 (0.5 g) | MMT (0.5 g) | Ethyl lactate (26 g) | 300 | A |
| Example 21 | | Monomer A (5.0 g) | Varifast Yellow 1101 (4.0 g) | Oxime A (0.5 g) | MMT (0.5 g) | Ethyl lactate (26 g) | 250 | A |
| Example 22 | | Monomer A (5.0 g) | Varifast Yellow 1101 (4.0 g) | Oxime B (0.5 g) | MMT (0.5 g) | Ethyl lactate (26 g) | 200 | A |

TABLE 2

| | Binder | Radical-polymerizable monomer | Colorant | Photo-polymerization initiator | Monofunctional or polyfunctional thiol compound | Organic solvent | Sensitivity (mJ/cm²) | Profile |
|---|---|---|---|---|---|---|---|---|
| Example 23 | Resin A (1.5 g) | Monomer A (3.0 g) | Varifast Yellow 1101 (4.0 g) | TAZ-107 (0.5 g) | MMT (1.0 g) | Cyclohexanone (26 g) | 400 | A |
| Example 24 | Resin A (1.0 g) | Monomer A (3.0 g) | Varifast Yellow 1101 (4.0 g) | TAZ-107 (0.5 g) | MMT (1.5 g) | Cyclohexanone (26 g) | 350 | A |
| Example 25 | Resin A (2.0 g) | Monomer A (3.0 g) | Varifast Yellow 1101 (4.0 g) | TAZ-107 (0.5 g) | MMT (0.5 g) | Cyclohexanone (26 g) | 400 | A |
| Example 26 | Resin A (2.0 g) | Monomer A (1.5 g) | Varifast Yellow 1101 (5.5 g) | TAZ-107 (0.5 g) | MMT (0.5 g) | Cyclohexanone (26 g) | 900 | A |
| Example 27 | Resin A (1.5 g) | Monomer A (2.5 g) | Varifast Yellow 1101 (2.0 g) Acid Red 57 (3.0 g) | TAZ-107 (0.5 g) | MMT (0.5 g) | Cyclohexanone (26 g) | 650 | A |
| Example 28 | Resin A (1.5 g) | Monomer A (2.5 g) | Varifast Yellow 1101 (2.0 g) Acid Red 57 (3.0 g) | Oxime A (0.5 g) | MMT (0.5 g) | Cyclohexanone (26 g) | 550 | A |
| Example 29 | Resin A (1.5 g) | Monomer A (2.5 g) | Varifast Yellow 1101 (2.0 g) Acid Red 57 (3.0 g) | Oxime B (0.5 g) | MMT (0.5 g) | Cyclohexanone (26 g) | 450 | A |
| Example 30 | Resin A (1.5 g) | Monomer A (2.5 g) | Varifast Yellow 1101 (2.0 g) Acid Red 57 (3.0 g) | TAZ-107 (0.5 g) | MMT (0.5 g) | Ethyl lactate (26 g) | 650 | A |
| Example 31 | Resin A (1.5 g) | Monomer A (2.5 g) | Varifast Yellow 1101 (2.0 g) Acid Red 57 (3.0 g) | Oxime A (0.5 g) | MMT (0.5 g) | Ethyl lactate (26 g) | 550 | A |
| Example 32 | Resin A (1.5 g) | Monomer A (2.5 g) | Varifast Yellow 1101 (2.0 g) Acid Red 57 (3.0 g) | Oxime B (0.5 g) | MMT (0.5 g) | Ethyl lactate (26 g) | 450 | A |
| Comparative Example 1 | Resin A (2.0 g) | Monomer A (3.5 g) | Varifast Yellow 1101 (4.0 g) | TAZ-107 (0.5 g) | | Cyclohexanone (26 g) | 2500 | C |
| Comparative Example 2 | Resin A (2.0 g) | Monomer A (3.0 g) | Varifast Yellow 1101 (4.0 g) | TAZ-107 (0.5 g) | TMMP (0.5 g) | Cyclohexanone (26 g) | 450 | C |
| Comparative Example 3 | Resin A (3.5 g) | Monomer A (1.5 g) | Varifast Yellow 1101 (4.0 g) | TAZ-107 (0.5 g) | MMT (0.5 g) | Cyclohexanone (26 g) | 950 | D |
| Comparative Example 4 | Resin A (2.5 g) | Monomer A (2.5 g) | Varifast Yellow 1101 (4.0 g) | TAZ-107 (0.5 g) | MMT (0.5 g) | Cyclohexanone (26 g) | 600 | D |
| Comparative Example 5 | Resin A (2.0 g) | Monomer A (0.5 g) | Varifast Yellow 1101 (5.5 g) | TAZ-107 (0.5 g) | MMT (0.5 g) | Cyclohexanone (26 g) | Pattern could not be formed | E |
| Comparative Example 6 | Resin A (0.5 g) | Monomer A (6.0 g) | Varifast Yellow 1101 (2.5 g) | TAZ-107 (0.5 g) | MMT (0.5 g) | Cyclohexanone (26 g) | Pattern could not be formed | E |

The respective abbreviations in Tables 1 and 2 indicate the following.
(Photopolymerization Initiator)
Oxime A: 2-(O-benzoyloxime)-1-[4-(phenylthio)phenyl]-1,2-octanedione (manufactured by Ciba Japan, K.K.)
Oxime B: 1-(O-acetyloxime)-1-[9-ethyl-6-(2-methylbenzoyl)-9H-carbazol-3-yl]ethanone
(Monofunctional Thiol Compound)
NPhMBI: N-phenyl mercaptobenzoimidazole
HMMBO: 5-hexanoxyethoxy-2-mercapto-6-methyl-1,3-benzoxazole
ETPh: 2-ethylthiophenol
MMET: 2-mercapto-5-methoxyethylthio-1,3,4-thiadiazole
MMT: 2-mercapto-5-methylthio-1,3,4-thiadiazole
(Polyfunctional Thiol Compound)
TMMP: trimethylolpropane tris(3-mercaptopropionate)

As shown in Tables 1 and 2, in the Examples using a monofunctional thiol compound, sensitivity was excellent and the rectangularity of the pattern was also favorable. Among these, those using a monofunctional heterocyclic thiol compound had yet more favorable sensitivity. In contrast, in Comparative Example 1, in which a monofunctional thiol compound was not used, both sensitivity and pattern rectangularity were poor. In Comparative Example 2, in which a polyfunctional thiol compound was used, sensitivity was favorable but the rectangularity of the profile was poor, having a reverse-taper shape. In Comparative Example 3, in which a large amount of binder was added, the sensitivity was low as compared to the Examples. Further, the color filter produced as above exhibited a profile with excellent rectangularity and without any development residue.

As described above, according to the present invention, a negative curable composition with excellent developability at high sensitivity that enables formation of a fine rectangular pattern can be provided even in a low-binder content formulation. Further, a color filter with high cost performance and excellent properties, in particular, a color filter for use in a solid-state image sensor, and a method of producing the same, can be provided.

All publications, patent applications, and technical standards mentioned in this specification are herein incorporated by reference to the same extent as if each individual publication, patent application, or technical standard was specifically and individually indicated to be incorporated by reference.

What is claimed is:

1. A negative curable composition comprising a colorant, a photopolymerization initiator, a radical polymerizable monomer, a binder, and a monofunctional thiol compound, wherein the content of the radical polymerizable monomer with respect to the total solid content of the composition is from about 10 mass % to about 50 mass %, the content of the binder with respect to the total solid content of the composition is about 10 mass % or less, and the content of the monofunctional thiol compound with respect to the total solid content of the composition is from about 5 mass % to about 20 mass %.

2. The negative curable composition of claim 1, wherein the content of the monofunctional thiol compound is less than the content of the radical polymerizable monomer.

3. The negative curable composition of claim 1, wherein the molecular weight of the monofunctional thiol compound is from about 100 to about 1500.

4. The negative curable composition of claim 1, wherein the monofunctional thiol compound is a heterocyclic thiol compound.

5. The negative curable composition of claim 1, wherein the content of the colorant with respect to the total solid content is from about 20 mass % to about 80 mass %.

6. The negative curable composition of claim 1, wherein the colorant is a dye that is soluble in an organic solvent.

7. The negative curable composition of claim 1, wherein the radical polymerizable monomer is a polyfunctional (meth)acrylic compound.

8. A color filter formed by using the negative curable composition of claim 1.

9. A method of producing a color filter comprising:
forming a negative curable composition layer on a substrate by applying the negative curable composition of claim 1; and
forming a pattern on the substrate by exposing the negative curable composition layer to light via a mask and developing the negative curable composition layer that has been exposed.

* * * * *